United States Patent
Sun et al.

(10) Patent No.: US 7,307,320 B2
(45) Date of Patent: Dec. 11, 2007

(54) DIFFERENTIAL MECHANICAL STRESS-PRODUCING REGIONS FOR INTEGRATED CIRCUIT FIELD EFFECT TRANSISTORS

(75) Inventors: Min-Chul Sun, Fishkill, NY (US); Young Way Teh, Singapore (SG)

(73) Assignees: Samsung Electronics Co., Ltd. (KR); Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/268,131

(22) Filed: Nov. 7, 2005

(65) Prior Publication Data
US 2007/0102779 A1    May 10, 2007

(51) Int. Cl.
*H01L 29/76* (2006.01)
*H01L 29/94* (2006.01)

(52) U.S. Cl. .................. 257/368; 257/396; 257/506; 257/E29.007; 257/E29.02

(58) Field of Classification Search ............... 257/368, 257/396, 506, 616, E29.007, E29.008, E29.02
See application file for complete search history.

(56) References Cited

U.S. PATENT DOCUMENTS

| | | | |
|---|---|---|---|
| 5,998,848 | A | 12/1999 | Brown et al. |
| 6,432,783 | B1 | 8/2002 | Lee |
| 6,518,178 | B1 | 2/2003 | Ma |
| 6,847,065 | B1 | 1/2005 | Lum |
| 6,876,053 | B1* | 4/2005 | Ma et al. ................... 257/500 |
| 2004/0173812 | A1* | 9/2004 | Currie et al. ............... 257/103 |
| 2004/0251479 | A1* | 12/2004 | Tsutsui et al. ............. 257/249 |
| 2005/0110039 | A1* | 5/2005 | Chi et al. .................. 257/178 |

FOREIGN PATENT DOCUMENTS

| | | |
|---|---|---|
| JP | 7-106559 A | 4/1995 |
| JP | 7-263690 A | 10/1995 |
| JP | 8-274332 A | 10/1996 |
| JP | 11-354784 A | 12/1999 |
| JP | 2000-101084 A | 4/2000 |
| JP | 2001-320046 A | 11/2001 |
| KR | 10-0228375 B1 | 8/1999 |
| KR | 10-0337199 B1 | 5/2002 |
| KR | 10-0344735 B1 | 7/2002 |
| KR | 10-0359773 B1 | 10/2002 |
| KR | 10-2004-0001894 A | 1/2004 |
| KR | 10-2004-0001907 A | 1/2004 |
| KR | 10-2004-0008631 A | 1/2004 |

* cited by examiner

*Primary Examiner*—Matthew E. Warren
(74) *Attorney, Agent, or Firm*—Myers Bigel Sibley & Sajovec, P.A.

(57) ABSTRACT

Integrated circuit field effect transistors include a substrate, an isolation region in the substrate that defines an active region in the substrate, spaced apart source/drain regions in the active region, a channel region in the active region between the spaced apart source/drain regions and an insulated gate on the channel region. A differential mechanical stress-producing region is configured to produce different mechanical stress in the channel region adjacent the isolation region compared to remote from the isolation region. The differential mechanical stress-producing region may be formed using patterned stress management films, patterned stress-changing implants and/or patterned silicide films, and can reduce undesired corner effects. Related fabrication methods also are described.

26 Claims, 7 Drawing Sheets

DIFFERENTIAL MECHANICAL STRESS-PRODUCING REGIONS FOR INTEGRATED CIRCUIT FIELD EFFECT TRANSISTORS

FIELD OF THE INVENTION

This invention relates to integrated circuit devices and fabrication methods, and more particularly to integrated circuit field effect transistors and fabrication methods therefor.

BACKGROUND OF THE INVENTION

Integrated circuits are widely used for consumer, commercial and other applications. As is well known to those having skill in the art, an integrated circuit may include a large number of active devices, such as transistors, on an integrated circuit substrate. As the integration density of integrated circuit devices continues to increase, effects may be produced that can degrade the performance of the integrated circuit transistors.

One widely used integrated circuit transistor is an integrated circuit field effect transistor. As is well known to those having skill in the art, an integrated circuit field effect transistor generally includes a substrate, such as a semiconductor substrate, and an isolation region, such as a shallow trench isolation region in the substrate, which defines an active region in the substrate. Spaced apart source/drain regions are provided in the active regions, and a channel region is provided in the active region between the spaced apart source/drain regions. An insulated gate is provided on the channel region. The insulated gate generally includes a gate insulating layer and a gate electrode. Source/drain and gate contacts also may be provided for the source/drain and gate regions, respectively. The source/drain and gate contacts may include silicide. The design and fabrication of integrated circuit field effect transistors is well known to those having skill in the art, and need not be described further herein.

As the integration density of integrated circuit field effect transistors continues to increase, undesirable effects may originate at the corner of the device, i.e., in the channel region under the insulated gate near the isolation regions. It has been found that the electric field in the insulated gate near the isolation region may become enhanced, which may lead to a reduction of the threshold voltage of the channel in that region compared to the threshold voltage of the channel remote from the isolation region. The lower threshold voltage may provide a parallel path for current conduction, which has different turn-on characteristics, and may adversely affect the performance of the device. Corner effects and potential techniques to reduce corner effects are described, for example, in U.S. Pat. No. 5,998,848 to Brown et al., entitled *Depleted Poly-Silicon Edged MOSFET Structure and Method,* and U.S. Pat. No. 6,432,783 to Lee, entitled *Method for Doping a Semiconductor Device Through a Mask.*

It is also known that the silicide contacts may produce unwanted effects adjacent the isolation region. Accordingly, techniques have been developed to pattern silicide contacts to avoid a boundary between a source/drain region and an isolation region remote from a channel region, as described, for example, in Korean Published Patent Applications 10-2004-0008631, 10-2004-0001907 and 10-2004-0001894.

SUMMARY OF THE INVENTION

Field effect transistors according to some embodiments of the present invention include a substrate, an isolation region in the substrate that defines an active region in the substrate, spaced apart source/drain regions in the active region, a channel region in the active region between the spaced apart source/drain regions and an insulated gate on the channel region. A differential mechanical stress-producing region is provided that is configured to produce different mechanical stress in the channel region adjacent the isolation region, compared to remote from the isolation region. In some embodiments, the differential material stress is sufficient to reduce, and in some embodiments prevent, turn-on of the channel region adjacent the isolation region prior to turn-on of the channel region remote from the isolation region. In some embodiments, the differential mechanical stress-producing region comprises a patterned stress management film. In other embodiments, the differential mechanical stress-producing region comprises a patterned stress-producing implant. In other embodiments, the differential mechanical stress-producing region comprises a patterned silicide film. Accordingly, a channel region of a field effect transistor has different mechanical stress therein adjacent the isolation region compared to remote from the isolation region.

Embodiments of the invention that use a stress management film to provide a differential stress-producing region can be used with both N-channel and P-channel field effect transistors. In particular, when the field effect transistor is an N-channel field effect transistor, the patterned stress management film is present at a first boundary of the source/drain regions and the channel region that is remote from the isolation region, and is absent from a second boundary of the source/drain regions and the channel region that is adjacent the isolation region. When the field effect transistor is a P-channel field effect transistor, the patterned stress management film is absent from a first boundary of the source/drain regions and the channel region that is remote from the isolation region and is present at a second boundary of the source/drain regions and the channel region that is adjacent the isolation region.

Patterned stress-producing implants also may be used to produce the differential mechanical stress-producing region according to some embodiments of the present invention, for both N-channel and P-channel field effect transistors. In particular, when the field effect transistor is an N-channel field effect transistor, the patterned stress-producing implant is absent at a first boundary of the source/drain regions and the channel region that is remote from the isolation region and is present at a second boundary of the source/drain regions and the channel region that is adjacent the isolation region. When the field effect transistor is a P-channel field effect transistor, the patterned stress-producing implant is present at a first boundary of the source/drain regions and the channel region that is remote from the isolation region and is absent from a second boundary of the source/drain regions and the channel region that is adjacent the isolation region.

When the differential mechanical stress-producing region comprises a patterned silicide film, the patterned silicide film may be used in both N-channel and P-channel field effect transistors. In particular, when the field effect transistor is an N-channel field effect transistor, the patterned silicide film is present at a first boundary of the source/drain regions and the channel region that is remote from the isolation region, and is absent from a second boundary of the source/drain regions and the channel region that is adjacent the isolation region. In some embodiments, a patterned silicide blocking film is provided on the substrate that is present at the second boundary and is absent from the first boundary. In other embodiments, a patterned gate sidewall spacer is provided on the substrate that is present at the second boundary and is absent from the first boundary. When the field effect transistor is a P-channel field effect transistor, the patterned silicide film is absent from the first boundary and is present on the second boundary. In some embodiments, this presence and absence of the silicide film is provided by a patterned silicide blocking film that is absent from the second boundary and is present at the first boundary. In other embodiments, this presence and absence of the silicide film is provided by a patterned gate sidewall spacer on the substrate that is absent from the second boundary and is present at the first boundary. In all of these embodiments, the silicide film may also be present on the gate electrode at the first boundary and at the second boundary.

Analogous methods of fabricating a field effect transistor may be provided according to various embodiments of the present invention, wherein an isolation region, an active region, spaced apart source/drain regions, a channel region and an insulated gate may be formed conventionally. A differential mechanical stress-producing region is formed in and/or on the substrate that is configured to produce differential mechanical stress in the channel region adjacent the isolation region compared to remote from the isolation region. Stress management films may be patterned, stress-producing ions may be implanted and/or a silicide film may be patterned, as was described above, to provide various embodiments of differential mechanical stress-producing regions.

DETAILED DESCRIPTION

Figure 1:
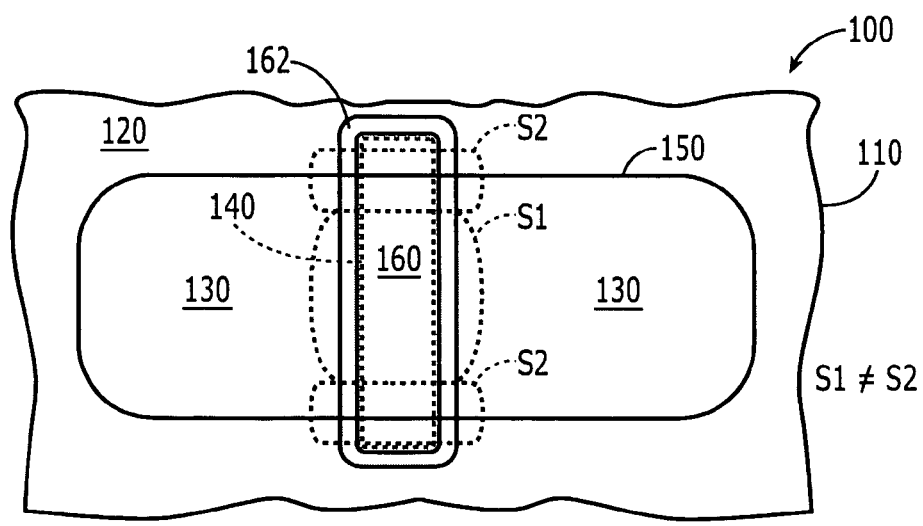
FIGS. 1-10 are top plan views of integrated circuit field effect transistors and fabrication methods therefor including differential mechanical stress-producing regions, according to various embodiments of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on" "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a" "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a top plan view of integrated circuit field effect transistors and fabrication methods therefor according to various embodiments of the present invention. As shown in FIG. 1, a field effect transistor 100 includes a substrate 110, an isolation region 120 in the substrate 110 that defines an active region 150 in the substrate, spaced apart source/drain regions 130 in the active region 150, a channel region 140 in the active region between the spaced apart source/drain regions 130 and an insulated gate 160 on the channel region. The integrated circuit substrate 110 may be a single and/or compound semiconductor integrated circuit substrate including one or more layers thereon and/or may be a semiconductor layer on the substrate. Example integrated circuit substrates can include monocrystalline silicon substrates or semiconductor-on-insulator substrates. The isolation region 120 may be formed using shallow trench isolation and/or many other techniques known to those having skill in the art. The insulated gate 160 may include a gate insulating layer adjacent the substrate 110 and a gate electrode on the gate insulating layer remote from the substrate 110. A gate sidewall spacer 162 also may be formed on a sidewall of the insulated gate 160. Contacts for the source/drain regions and the insulated gate 160 also may be provided, for example using silicide techniques well known to those having skill in the art. The design and fabrication of integrated circuit field effect transistors as described in this paragraph are well known to those having skill in the art, and need not be described further herein.

Embodiments of the present invention can provide a differential mechanical stress-producing region in and/or on the substrate 110 that is configured to produce different mechanical stress in the channel region adjacent the isolation region, as indicated by mechanical stress S2 in FIG. 1, compared to remote from the isolation region, as indicated by mechanical stress S1 in FIG. 1. Accordingly, S1 and S2 are not equal, so that different mechanical stress is provided in the channel region 140 adjacent the isolation region 120 compared to remote from the isolation region 120. Corner effects may thereby be reduced or eliminated.

According to some embodiments of the present invention, the differential mechanical stress-producing region may be produced using a patterned stress management film, a patterned stress-producing implant and/or a patterned silicide film. Accordingly, differential mechanical stress can be present in the channel region 140 adjacent the isolation region 120 compared to remote from the isolation region 120. The stress may be sufficiently large so as to reduce or prevent corner effects.

FIGS. 2-10 are top plan views illustrating various differential mechanical stress-producing regions according to various embodiments of the present invention. Moreover, the boundary of the source/drain regions 130 and the channel region 140 that is adjacent the isolation region 120 will be referred to as a second boundary B2, and the boundary of the source/drain regions 130 and the channel region that is remote from the isolation region 120 will be referred to as a first boundary B1.

Figure 2:
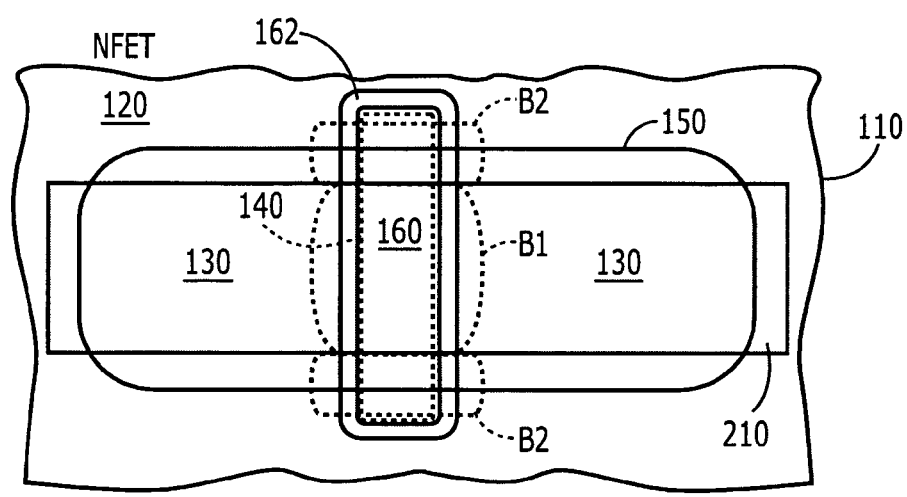
Figure 3:
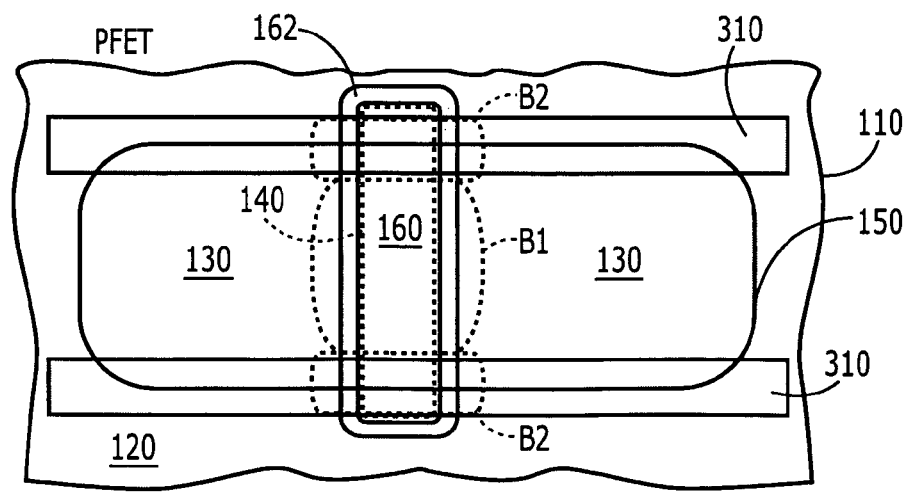

FIGS. 2 and 3 are top plan views of field effect transistors wherein the differential mechanical stress-producing region comprises a patterned stress management film. Stress management films are well known to those having skill in the art, and may comprise, for example, a layer of silicon nitride that is formed on the field effect transistor, to cause tensile and/or compressive stress on the channel of a field effect transistor. A spike anneal may then be performed to "memorize" the stress from the stress nitride film into the channel. The stress nitride film may then be removed, to provide differential mechanical stress-producing regions in the channel. In other embodiments, the stress nitride film is retained. The fabrication of stress management films is well known to those having skill in the art, and need not be described further herein.

As illustrated in FIGS. 2 and 3, a stress management film may be patterned according to embodiments of the present invention, to provide the differential mechanical stress-producing region. Thus, in the N-channel field effect transistor (NFET) of FIG. 2, a stress management film 210 is provided that is present at a first boundary B1 of the source/drain regions 130 and the channel region 140 that is remote from the isolation region 120. The stress management film 210 is absent from a second boundary region B2 of the source/drain regions 130 and the channel region 140 that is adjacent the isolation region 120. In contrast, in FIG. 3, for a P-channel field effect transistor (PFET), the patterned stress management film 310 is absent from the first boundary B1 of the source/drain regions 130 and the channel region 140 that is remote from the isolation region 120, and is present at a second boundary region B2 of the source/drain regions 130 and the channel region 140 that is adjacent the isolation region 120. The differential mechanical stress-producing regions of FIGS. 2 and 3 may be formed by patterning a stress management film 210 and/or 310, as shown in FIGS. 2 and 3, respectively.

Figure 4:
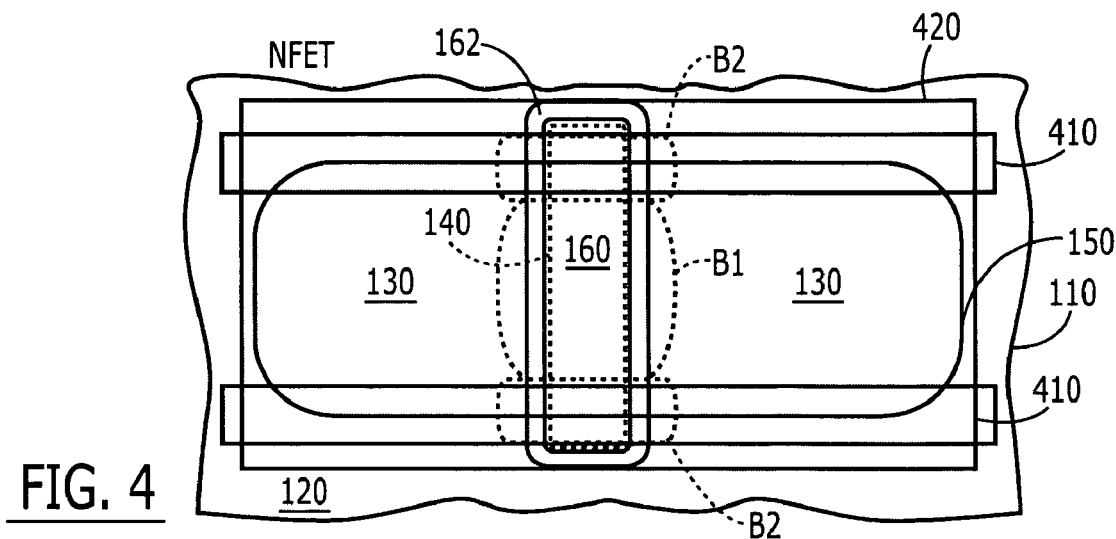
Figure 5:
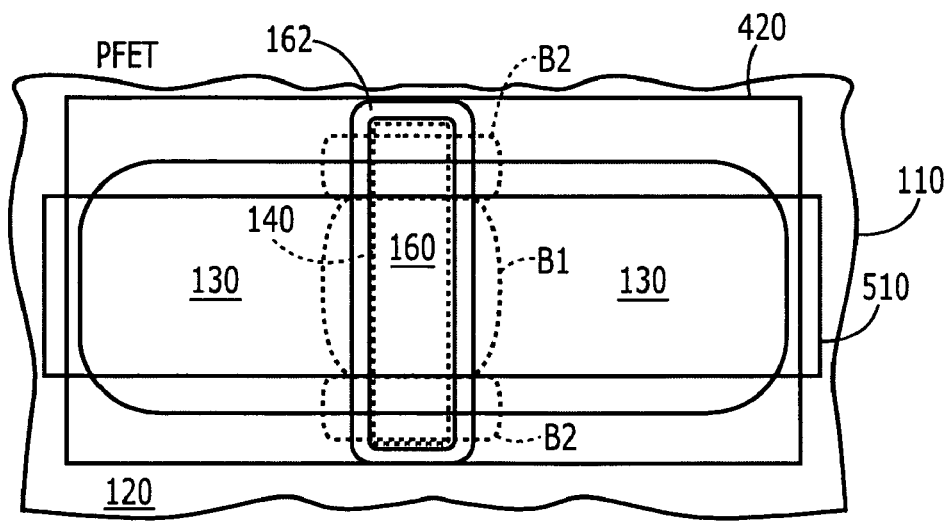

FIGS. 4 and 5 are top plan views of embodiments of the present invention wherein the differential mechanical stress-producing region comprises a patterned stress-changing implant that is selectively implanted. In particular, for the NFET of FIG. 4, a compressive stress liner 420 may be formed over the entire active region 150, as shown, and stress-relaxing implants, such as germanium implants 410, may be selectively implanted. Accordingly, as shown in FIG. 4, the stress-changing implant 410 is present at the second boundary region B2, and is absent from the first boundary region B1. In contrast, for a PFET device, as shown in FIG. 5, the stress-changing implant 510 is absent from the second boundary B2, but is present at the first boundary B1. The germanium implants 410 and/or 510 relax the stress that is produced by the compressive stress liner 420, to thereby produce the differential mechanical stress-producing region. It will also be understood that the implanted regions 410 and 510 may be used without the need for a separate compressive stress liner 420.

Figure 6:
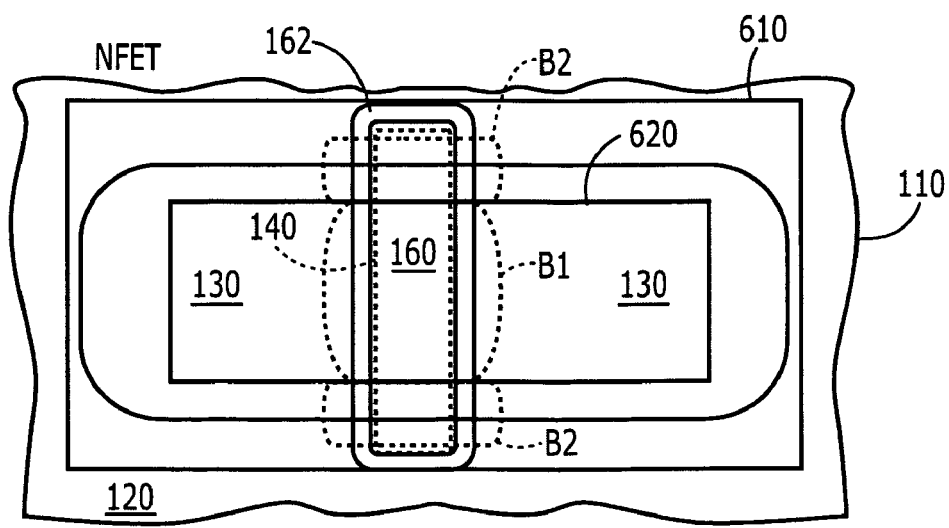
Figure 7:
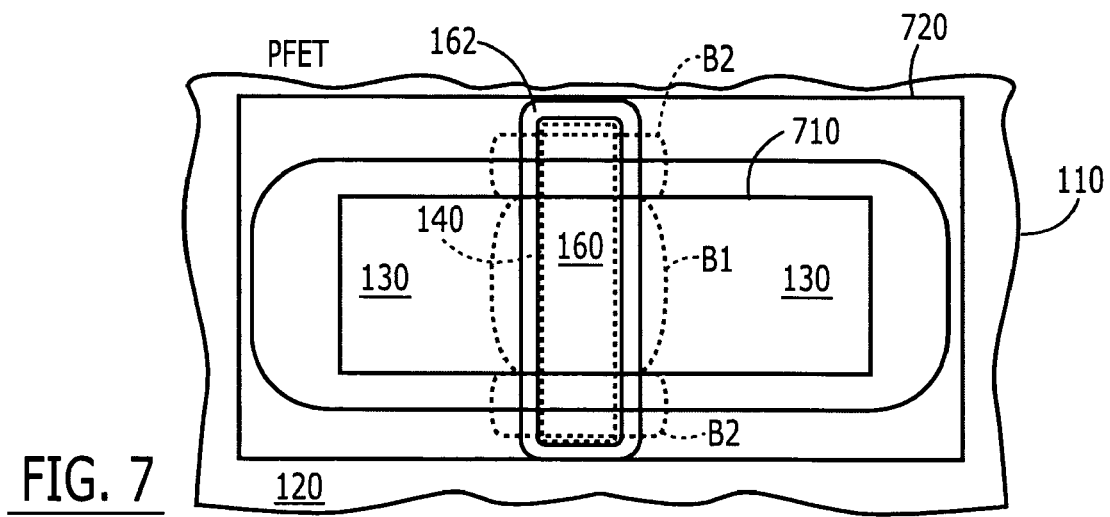

FIGS. 6 and 7 are top plan views of embodiments of the present invention for an NFET and a PFET, respectively, wherein the differential mechanical stress-producing region comprises a silicide film. In particular, as shown in FIG. 6, for an NFET, a silicide blocking film 610 is provided, to cover the second boundary B2, while exposing the first boundary B1. Accordingly, in a siliciding step, silicide 620 is formed on the first boundary region B1, but is absent on the second boundary region B2. In contrast, for a PFET, as shown in FIG. 7, a silicide blocking region 710 is formed at the first boundary region B1, so that silicide 720 is formed on the second boundary region B2.

Figure 8:
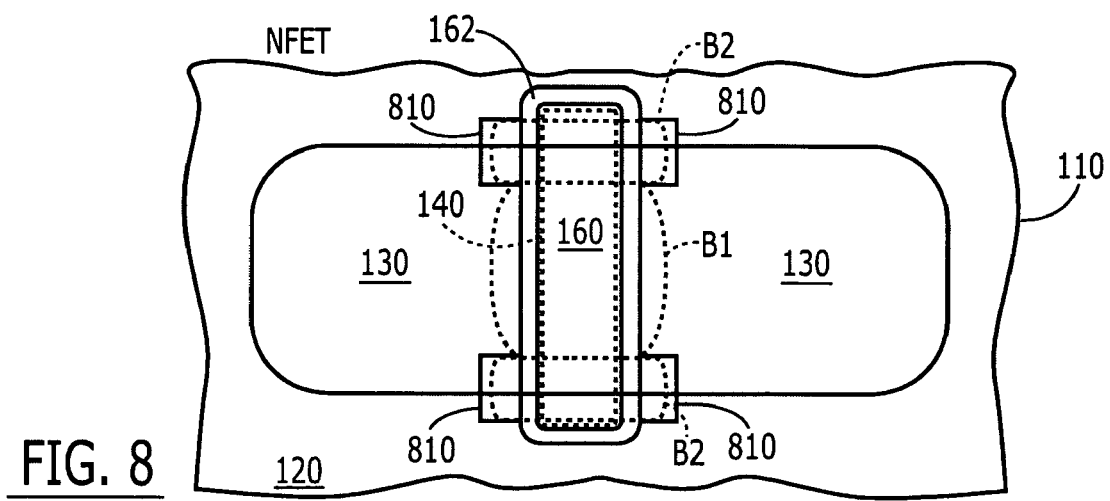
Figure 9:
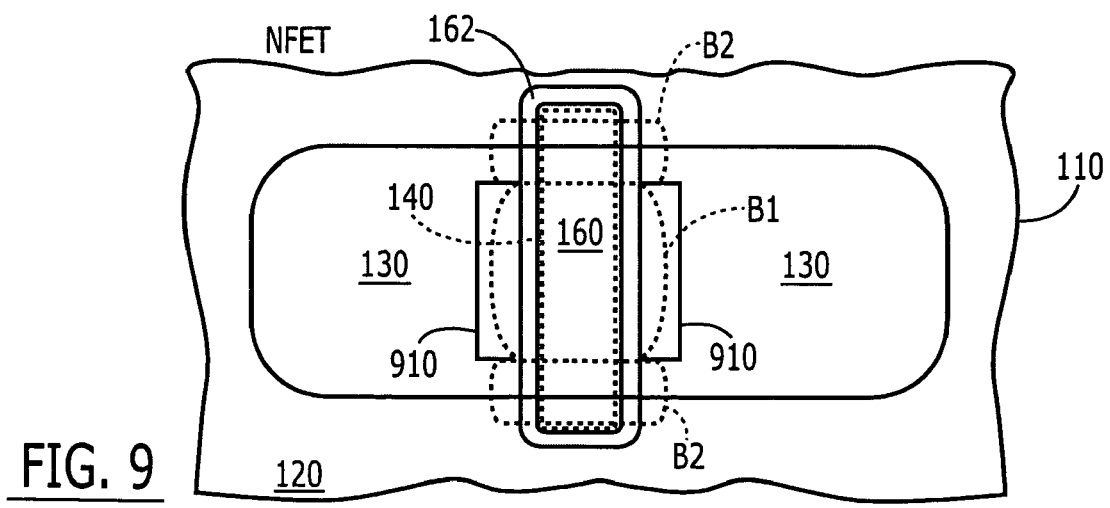

FIGS. 8 and 9 illustrate other embodiments of the present invention wherein the differential mechanical stress-producing region comprises a silicide film. In these embodiments, for an NFET, an additional gate sidewall spacer 810 is selectively formed in the second boundary region B2, but is absent in the first boundary region B1. Thus, silicidation is blocked in the first boundary region B2, but is present in the second boundary region B1. In contrast, for a PFET, as shown in FIG. 9, an additional gate sidewall spacer 910 is formed in the first boundary region B1, but is absent in the second boundary region B2. Thus, silicidation is blocked by the second sidewall spacers 910 in the first boundary region B1, but is allowed in the second boundary region B2. It will also be understood by those having skill in the art that, in embodiments of FIGS. 6-9, the silicide film also may be present on the gate electrode 160 at both the first boundary B1 and the second boundary B2. Low contact resistance gate electrodes 160 thereby may be formed.

Figure 10:
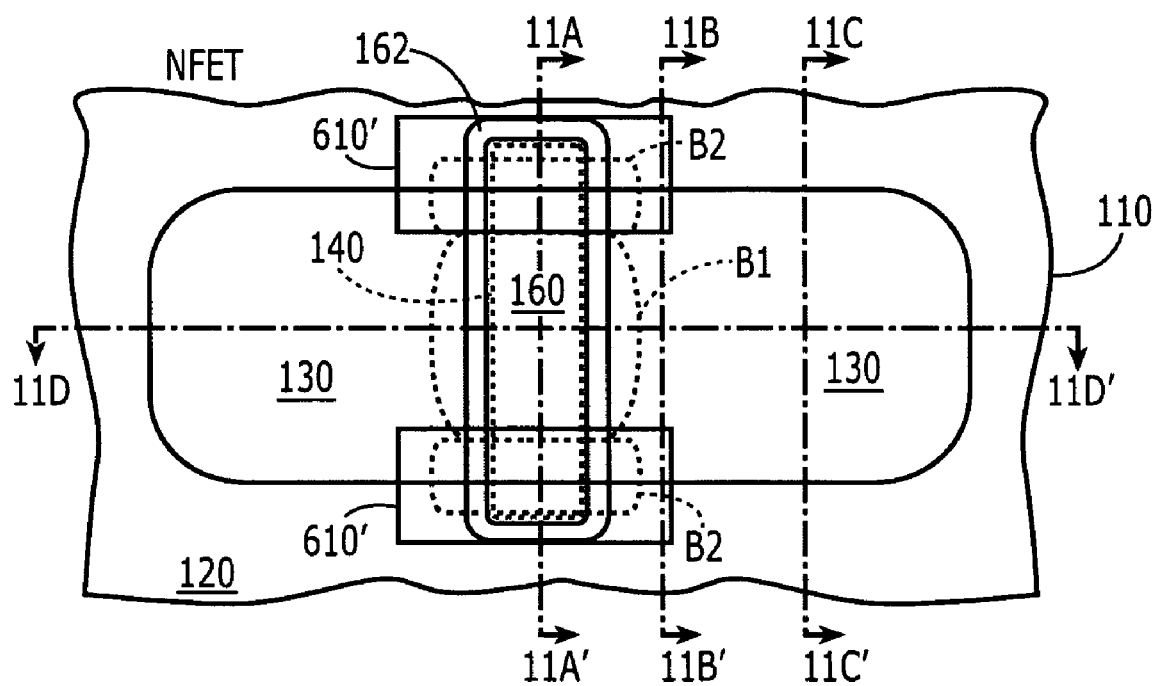

FIG. 10 is a top plan view of alternative embodiments of FIG. 6. As shown in FIG. 10, in these embodiments of an NFET, the silicide blocking layer 610' extends on the second boundary region B2, but need not extend beyond the second boundary region B2.

Figure 11A:
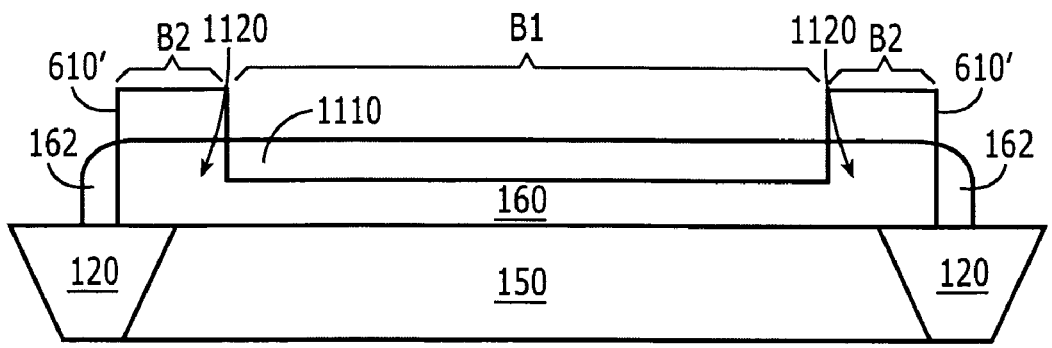
FIGS. 11A-11D are side cross-sectional views of integrated circuit field effect transistors of FIG. 10, according to various embodiments of the present invention.
Figure 11B:
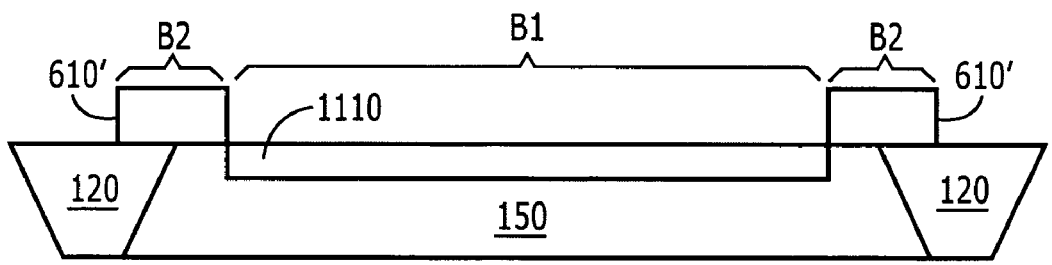
Figure 11C:
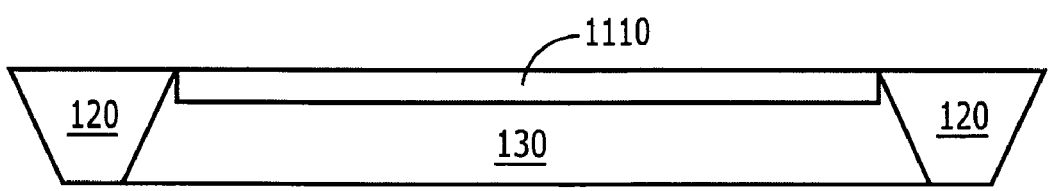
Figure 11D:
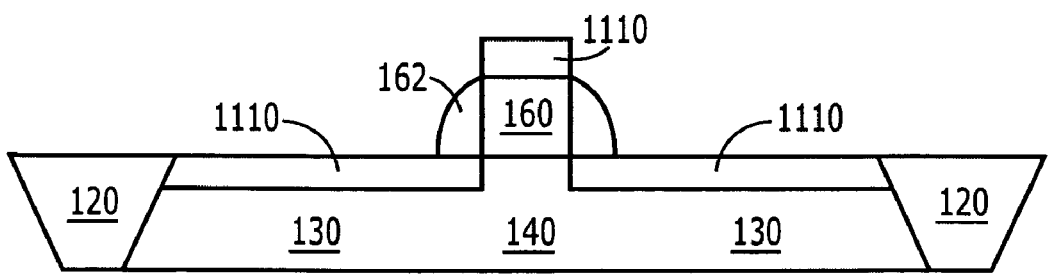

FIGS. 11A-11D are side cross-sectional views of the field effect transistor of FIG. 10, along the lines 11A-11A' through 11D-11D' of FIG. 10. In particular, as shown in FIG. 11A, along the gate 160, a silicide region 1110 is present on the center of the gate, adjacent boundary region B1, but is absent from the gate at the ends thereof adjacent the isolation region 120 and boundary region B2, as shown at 1120. As shown in FIG. 11B, outside the channel region 140 and in the source/drain regions 130 adjacent the channel region 140, a silicide layer 1110 is present at boundary region B1 and is absent from boundary region B2. As shown in FIG. 11C, outside the silicide blocking area 610' the silicide layer 1110 extends all the way to the isolation region 120. Finally, as shown in FIG. 11D, orthogonal to the gate 160, the silicide layer 1110 also extends all the way to the isolation region 120.

Figure 12A:
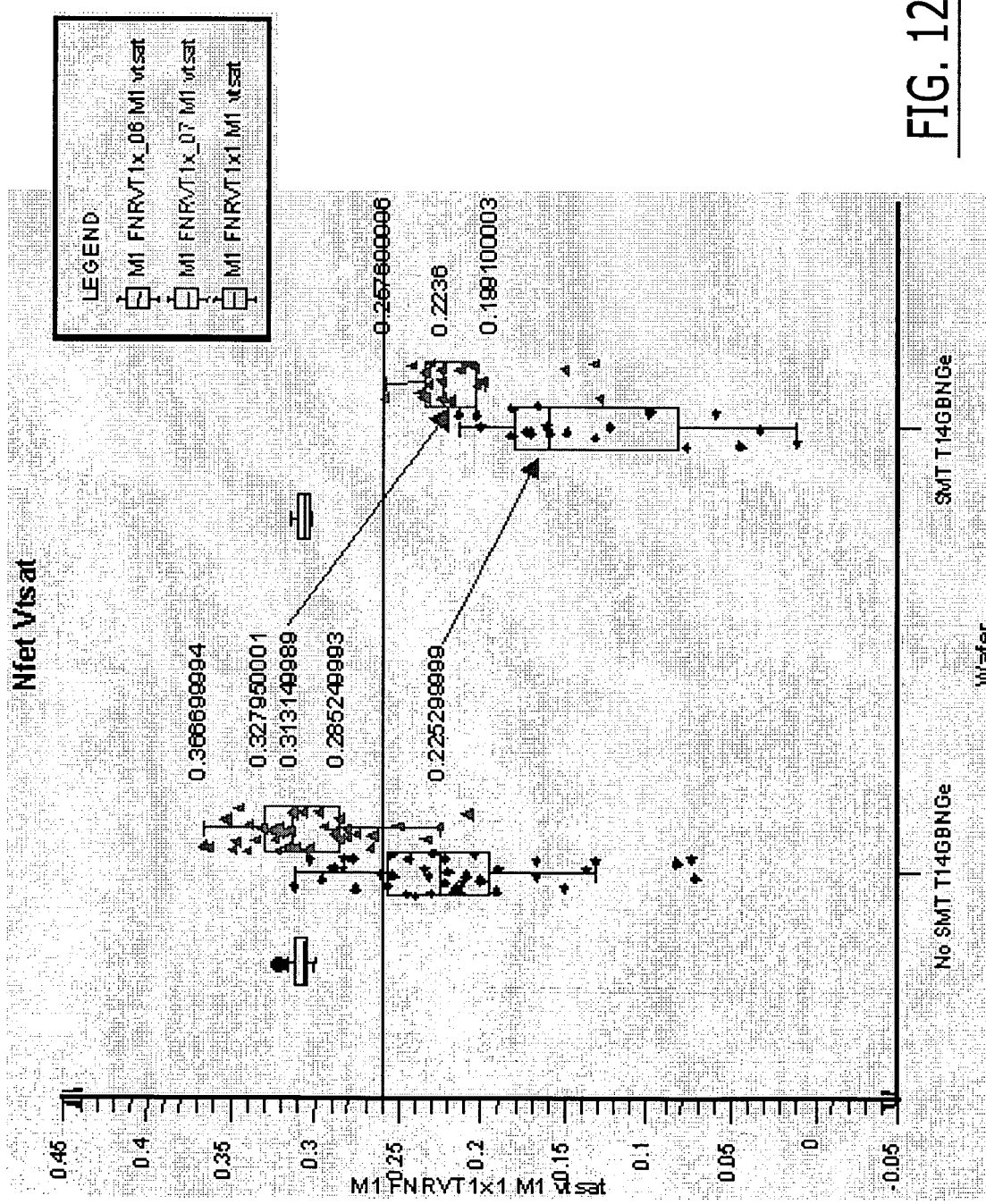
FIGS. 12A and 12B graphically illustrate changes in threshold voltage and overlap capacitance, respectively, for conventional field effect transistors and field effect transistors that include differential mechanical stress-producing regions according to various embodiments of the present invention.

FIG. 12A graphically illustrates changes in threshold voltage of N-channel field effect transistors that do not include a differential mechanical stress-producing region (left side of FIG. 12A), and that include a differential mechanical stress-producing region according exemplary embodiments of the present invention (right side of FIG. 12A). Gate lengths of 0.5 µm, 0.7 µm and 1.0 µm were used. In FIG. 12A, patterned stress-changing implants of FIG. 4 were used. As illustrated in FIG. 12A, the threshold voltage decreases and the distribution of threshold voltages also narrows, which indicates reduced corner effects.

Figure 12B:
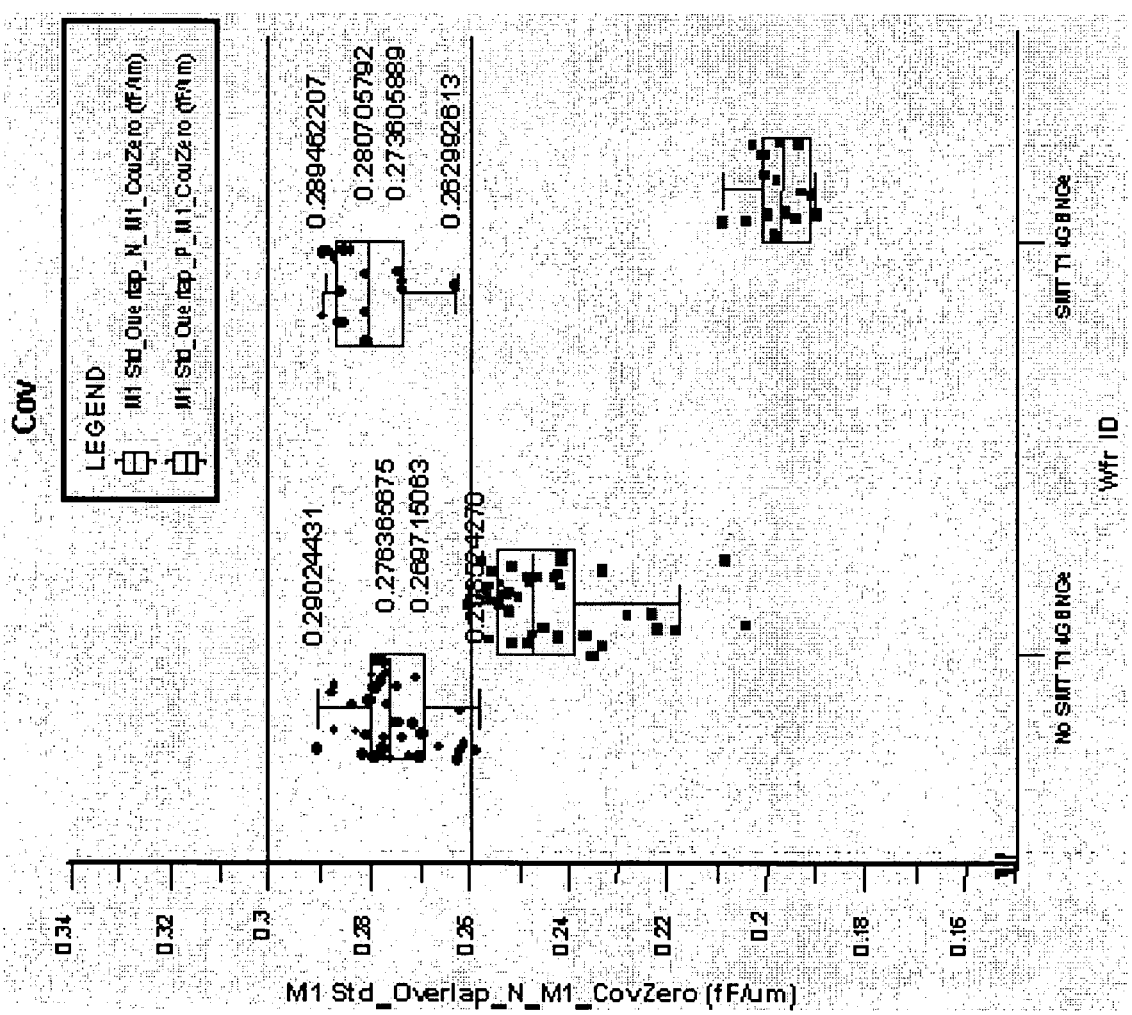

FIG. 12B illustrates changes in overlap capacitance for the same transistors, without a differential mechanical stress-producing region (left side of FIG. 12B) and with a differential mechanical stress-producing region according to embodiments of the invention (right side of FIG. 12B). As shown at the top portion of FIG. 12B, the overlap capacitance does not change when differential mechanical stress-producing regions are used, which indicates that the threshold voltage is not being changed due to changes in thermal budget, but, rather, is being changed by differential mechanical stress, as was shown in FIG. 12A. Accordingly, threshold voltage may be lowered and distribution may be narrowed according to some embodiments of the invention without changing overlap capacitance.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A field effect transistor comprising:
   a substrate;
   an isolation region in the substrate that defines an active region in the substrate;
   spaced apart source/drain regions in the active region;
   a channel region in the active region between the spaced apart source/drain regions;
   an insulated gate on the channel region; and
   a differential mechanical stress-producing region that is configured to produce different mechanical stress in the channel region adjacent the isolation region compared to remote from the isolation region; wherein the differential mechanical stress-producing region is present at a first boundary of the source/drain regions and the channel region that is remote from the isolation region and is absent from a second boundary of the source/drain regions and the channel region that is adjacent the isolation region.

2. A field effect transistor according to claim 1 wherein the differential mechanical stress-producing region comprises a patterned stress management film.

3. A field effect transistor according to claim 1 wherein the differential mechanical stress-producing region comprises a patterned stress-changing implant.

4. A field effect transistor according to claim 1 wherein the differential mechanical stress-producing region comprises a patterned silicide film.

5. A field effect transistor according to claim 4, further comprising a patterned silicide blocking film on the substrate that is present at the second boundary of the source/drain regions and the channel region that is adjacent the isolation region and is absent from the first boundary of the source/drain regions and the channel region that is remote from the isolation region.

6. A field effect transistor according to claim 4, further comprising a patterned gate sidewall spacer on the substrate that is present at the second boundary of the source/drain regions and the channel region that is adjacent the isolation region and is absent from the first boundary of the source/drain regions and the channel region that is remote from the isolation region.

7. A field effect transistor according to claim 4, wherein the patterned silicide film is also present on the gate electrode at the first boundary and at the second boundary.

8. A field effect transistor according to claim 1 wherein the differential mechanical stress-producing region comprises a patterned stress memorized region in the channel.

9. A field effect transistor comprising:
   a substrate;
   an isolation region in the substrate that defines an active region in the substrate;
   spaced apart source/drain regions in the active region;
   a channel region in the active region between the spaced apart source/drain regions;
   an insulated gate on the channel region;
   a differential mechanical stress-producing region comprising a patterned silicide film that is configured to produce different mechanical stress in the channel region adjacent the isolation region compared to remote from the isolation region, wherein the field effect transistor is an N-channel field effect transistor and wherein the patterned silicide film is present at a first boundary of the source/drain regions and the channel region that is remote from the isolation region and is absent from a second boundary of the source/drain regions and the channel region that is adjacent the isolation region; and a patterned silicide blocking film on the substrate that is present at the second boundary of the source/drain regions and the channel region that is adjacent the isolation region and is absent from the first boundary of the source/drain regions and the channel region that is remote from the isolation region.

10. A field effect transistor according to claim 9 wherein the patterned silicide film is also present on the gate electrode at the first boundary and at the second boundary.

11. A field effect transistor comprising:
a substrate;
an isolation region in the substrate that defines an active region in the substrate;
spaced apart source/drain regions in the active region;
a channel region in the active region between the spaced apart source/drain regions;
an insulated gate on the channel region;
a differential mechanical stress-producing region comprising a patterned silicide film that is configured to produce different mechanical stress in the channel region adjacent the isolation region compared to remote from the isolation region, wherein the field effect transistor is an N-channel field effect transistor and wherein the patterned silicide film is present at a first boundary of the source/drain regions and the channel region that is remote from the isolation region and is absent from a second boundary of the source/drain regions and the channel region that is adjacent the isolation region; and
a patterned gate sidewall spacer on the substrate that is present at the second boundary of the source/drain regions and the channel region that is adjacent the isolation region and is absent from the first boundary of the source/drain regions and the channel region that is remote from the isolation region.

12. A field effect transistor comprising:
a substrate;
an isolation region in the substrate that defines an active region in the substrate;
spaced apart source/drain regions in the active region;
a channel region in the active region between the spaced apart source/drain regions;
an insulated gate on the channel region;
a differential mechanical stress-producing region comprising a patterned silicide film that is configured to produce different mechanical stress in the channel region adjacent the isolation region compared to remote from the isolation region, wherein the field effect transistor is a P-channel field effect transistor and wherein the patterned silicide film is absent from a first boundary of the source/drain regions and the channel region that is remote from the isolation region and is present at a first boundary of the source/drain regions and the channel region that is adjacent the isolation region; and
a patterned silicide blocking film on the substrate that is absent from the second boundary of the source/drain regions and the channel region that is adjacent the isolation region and is present at the first boundary of the source/drain regions and the channel region that is remote from the isolation region.

13. A field effect transistor according to claim 12 wherein the patterned silicide film is also present on the gate electrode at the first boundary and at the second boundary.

14. A field effect transistor comprising:
a substrate;
an isolation region in the substrate that defines an active region in the substrate;
spaced apart source/drain regions in the active region;
a channel region in the active region between the spaced apart source/drain regions;
an insulated gate on the channel region;
a differential mechanical stress-producing region comprising a patterned silicide film that is configured to produce different mechanical stress in the channel region adjacent the isolation region compared to remote from the isolation region, wherein the field effect transistor is a P-channel field effect transistor and wherein the patterned silicide film is absent from a first boundary of the source/drain regions and the channel region that is remote from the isolation region and is present at a first boundary of the source/drain regions and the channel region that is adjacent the isolation region; and
a patterned gate sidewall spacer on the substrate that is absent from the second boundary of the source/drain regions and the channel region that is adjacent the isolation region and is present at the first boundary of the source/drain regions and the channel region that is remote from the isolation region.

15. A field effect transistor comprising:
a substrate;
an isolation region in the substrate that defines an active region in the substrate;
spaced apart source/drain regions in the active region;
a channel region in the active region between the spaced apart source/drain regions;
an insulated gate on the channel region;
a first patterned stress management material that is present at a first boundary of the source/drain regions and the channel region that is remote from the isolation region and is absent from a second boundary of the source/drain regions and the channel region that is adjacent the isolation region; and
a second patterned stress management material that is present at the second boundary of the source/drain regions and the channel region that is adjacent the isolation region and is absent from the first boundary of the source/drain regions and the channel region that is remote from the isolation region.

16. A field effect transistor according to claim 15, wherein the field effect transistor is an N-channel field effect transistor.

17. A field effect transistor according to claim 16, wherein the first patterned stress management material is a patterned silicide film.

18. A field effect transistor according to claim 17, wherein the second patterned stress management material is a patterned silicide blocking film.

19. A field effect transistor according to claim 17, wherein the second patterned stress management material is a patterned gate sidewall spacer.

20. A field effect transistor according to claim 17, wherein the patterned silicide film is also present on the gate electrode at the first boundary and at the second boundary.

21. A field effect transistor according to claim 19, wherein the field effect transistor is a P-channel field effect transistor.

22. A field effect transistor according to claim 21, wherein the second patterned stress management material is a patterned silicide film.

23. A field effect transistor according to claim 22, wherein the first patterned stress management material is a patterned silicide blocking film.

24. A field effect transistor according to claim 22, wherein the first patterned stress management material is a patterned gate sidewall spacer.

25. A field effect transistor according to claim 22, wherein the patterned silicide film is also present on the gate electrode at the first boundary and at the second boundary.

26. A field effect transistor according to claim 15, wherein the first and second patterned stress management materials are configured to produce different mechanical stress in the channel region adjacent the isolation region compared to remote from the isolation region.

* * * * *